US012813218B2

(12) United States Patent
Theil

(10) Patent No.: US 12,813,218 B2
(45) Date of Patent: Nov. 24, 2026

(54) DIRECT BONDING AND DEBONDING OF ELEMENTS

(71) Applicant: ADEIA SEMICONDUCTOR BONDING TECHNOLOGIES INC., San Jose, CA (US)

(72) Inventor: Jeremy Alfred Theil, Mountain View, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 517 days.

(21) Appl. No.: 18/067,305

(22) Filed: Dec. 16, 2022

(65) Prior Publication Data

US 2023/0197496 A1 Jun. 22, 2023

Related U.S. Application Data

(60) Provisional application No. 63/265,761, filed on Dec. 20, 2021.

(51) Int. Cl.
*H01L 21/78* (2006.01)
*B32B 43/00* (2006.01)
(Continued)

(52) U.S. Cl.
CPC ............ *H10P 72/74* (2026.01); *B32B 43/006* (2013.01); *B32B 2457/14* (2013.01); *C23C 16/26* (2013.01);
(Continued)

(58) Field of Classification Search
CPC ........... H01L 21/6835; H01L 21/02115; H01L 21/02274; H01L 2221/68327;
(Continued)

(56) References Cited

U.S. PATENT DOCUMENTS

| | | | |
|---|---|---|---|
| 5,034,343 | A | 7/1991 | Rouse et al. |
| 5,322,593 | A | 6/1994 | Hasegawa et al. |

(Continued)

FOREIGN PATENT DOCUMENTS

| | | | |
|---|---|---|---|
| CN | 107611075 | A | 1/2018 |
| CN | 112968078 | A | 6/2021 |

(Continued)

OTHER PUBLICATIONS

"An Overview of Temporary Wafer Bonding Processes," Processing Theories, https://www.brewerscience.com/processing-theories/temporary-bonding/, downloaded Aug. 23, 2022, 11 sheets.

(Continued)

*Primary Examiner* — Vu A Vu
(74) *Attorney, Agent, or Firm* — Knobbe, Martens, Olson & Bear, LLP

(57) ABSTRACT

A bonding method is disclosed. The bonding method can include providing a first element having a device portion and a first nonconductive bonding material disposed over the device portion of the first element. The bonding method can include providing a second element that includes a carrier. The second element having a substrate and a second nonconductive bonding material disposed over the substrate of the second element. The bonding method can include depositing a release layer between the device portion and the first nonconductive bonding material of the first element or between the substrate and the second nonconductive bonding material of the second element. The bonding method can include directly bonding the first nonconductive bonding material of the first element to the second nonconductive bonding material of the second element without an intervening adhesive. The bonding method can include removing the second element from the first element by transferring
(Continued)

thermal energy to the release layer to thereby induce diffusion of gas including volatile species out of the release layer.

20 Claims, 6 Drawing Sheets

(51) Int. Cl.
*H10P 72/70* (2026.01)
*C23C 16/26* (2006.01)
*H10P 14/60* (2026.01)
*H10P 14/69* (2026.01)

(52) U.S. Cl.
CPC ...... *H10P 14/6336* (2026.01); *H10P 14/6902* (2026.01); *H10P 72/7416* (2026.01); *H10P 72/744* (2026.01)

(58) Field of Classification Search
CPC . H01L 2221/68381; H01L 2221/68318; H01L 2221/6834; H01L 21/78; B32B 43/006; B32B 2457/14; C23C 16/26
USPC .......................................................... 438/759
See application file for complete search history.

(56) References Cited

U.S. PATENT DOCUMENTS 5,753,536 A 5/1998 Sugiyama et al.
5,771,555 A 6/1998 Eda et al.
5,985,742 A 11/1999 Henley et al.
6,080,640 A 6/2000 Gardner et al.
6,423,640 B1 7/2002 Lee et al.
6,465,892 B1 10/2002 Suga
6,867,067 B2 * 3/2005 Ghyselen .............. H01L 21/318 438/455
6,887,769 B2 5/2005 Kellar et al.
6,908,027 B2 6/2005 Tolchinsky et al.
7,045,453 B2 5/2006 Canaperi et al.
7,105,980 B2 9/2006 Abbott et al.
RE39,484 E 2/2007 Bruel
7,193,423 B1 3/2007 Dalton et al.
7,226,812 B2 6/2007 Lu et al.
7,713,840 B2 5/2010 Kelly et al.
7,750,488 B2 7/2010 Patti et al.
7,759,050 B2 7/2010 Kessel et al.
7,795,113 B2 9/2010 Swinnen et al.
7,803,693 B2 9/2010 Trezza
7,910,458 B2 3/2011 Henley
7,932,614 B2 4/2011 Codding et al.
8,053,335 B2 11/2011 Yonehara et al.
8,183,127 B2 5/2012 Patti et al.
8,349,635 B1 1/2013 Gan et al.
8,377,798 B2 2/2013 Peng et al.
8,441,131 B2 5/2013 Ryan
8,461,017 B2 6/2013 Sadaka et al.
8,476,165 B2 7/2013 Trickett et al.
8,482,132 B2 7/2013 Yang et al.
8,501,537 B2 8/2013 Sadaka et al.
8,505,197 B2 8/2013 Blanchard
8,524,533 B2 9/2013 Tong et al.
8,620,164 B2 12/2013 Heck et al.
8,647,987 B2 2/2014 Yang et al.
8,697,493 B2 4/2014 Sadaka
8,716,105 B2 5/2014 Sadaka et al.
8,802,538 B1 8/2014 Liu
8,809,123 B2 8/2014 Liu et al.
8,815,620 B2 8/2014 Park et al.
8,841,002 B2 9/2014 Tong
9,093,350 B2 7/2015 Endo et al.
9,142,517 B2 9/2015 Liu et al.
9,171,756 B2 10/2015 Enquist et al.
9,184,125 B2 11/2015 Enquist et al.
9,224,704 B2 12/2015 Landru
9,230,941 B2 1/2016 Chen et al.
9,257,399 B2 2/2016 Kuang et al.
9,299,736 B2 3/2016 Chen et al.
9,308,697 B2 4/2016 Ke et al.
9,312,229 B2 4/2016 Chen et al.
9,331,149 B2 5/2016 Tong et al.
9,337,235 B2 5/2016 Chen et al.
9,385,024 B2 7/2016 Tong et al.
9,394,161 B2 7/2016 Cheng et al.
9,397,001 B2 * 7/2016 Tanaka ............... H10D 30/6758
9,431,368 B2 8/2016 Enquist et al.
9,437,572 B2 9/2016 Chen et al.
9,437,832 B2 * 9/2016 Sakuishi ................. B32B 37/18
9,443,796 B2 9/2016 Chou et al.
9,450,115 B2 9/2016 Christensen et al.
9,461,007 B2 10/2016 Chun et al.
9,496,239 B1 11/2016 Edelstein et al.
9,536,848 B2 1/2017 England et al.
9,559,081 B1 1/2017 Lai et al.
9,620,481 B2 4/2017 Edelstein et al.
9,656,852 B2 5/2017 Cheng et al.
9,723,716 B2 8/2017 Meinhold
9,728,521 B2 8/2017 Tsai et al.
9,741,620 B2 8/2017 Uzoh et al.
9,761,493 B2 * 9/2017 Celler ................. H01L 21/7813
9,799,587 B2 10/2017 Fujii et al.
9,832,880 B2 11/2017 Tsai et al.
9,852,988 B2 12/2017 Enquist et al.
9,893,004 B2 2/2018 Yazdani
9,929,050 B2 3/2018 Lin
9,929,054 B2 3/2018 Yonehara et al.
9,941,241 B2 4/2018 Edelstein et al.
9,941,243 B2 4/2018 Kim et al.
9,953,941 B2 4/2018 Enquist
9,954,080 B2 * 4/2018 Or-Bach ................ H10B 12/09
9,960,142 B2 5/2018 Chen et al.
10,002,844 B1 6/2018 Wang et al.
10,026,605 B2 7/2018 Doub et al.
10,075,657 B2 9/2018 Fahim et al.
10,086,584 B2 10/2018 Bellman et al.
10,157,766 B2 12/2018 Kang et al.
10,181,546 B2 1/2019 Zou et al.
10,189,048 B2 * 1/2019 Yamazaki .............. B05D 3/068
10,204,893 B2 2/2019 Uzoh et al.
10,236,408 B2 * 3/2019 Yamazaki ............ H10D 86/423
10,269,756 B2 4/2019 Uzoh
10,276,619 B2 4/2019 Kao et al.
10,276,909 B2 4/2019 Huang et al.
10,418,277 B2 9/2019 Cheng et al.
10,446,456 B2 10/2019 Shen et al.
10,446,487 B2 10/2019 Huang et al.
10,446,532 B2 10/2019 Uzoh et al.
10,508,030 B2 12/2019 Katkar et al.
10,522,499 B2 12/2019 Enquist et al.
10,529,693 B2 1/2020 Agarwal et al.
10,607,883 B2 3/2020 Maruyama et al.
10,707,087 B2 7/2020 Uzoh et al.
10,784,191 B2 9/2020 Huang et al.
10,790,262 B2 9/2020 Uzoh et al.
10,797,202 B2 10/2020 Danesh et al.
10,840,135 B2 11/2020 Uzoh
10,840,205 B2 11/2020 Fountain, Jr. et al.
10,854,578 B2 12/2020 Morein
10,879,212 B2 12/2020 Uzoh et al.
10,886,177 B2 1/2021 DeLaCruz et al.
10,892,246 B2 1/2021 Uzoh
10,923,408 B2 2/2021 Huang et al.
10,923,413 B2 2/2021 DeLaCruz
10,950,547 B2 3/2021 Mohammed et al.
10,964,664 B2 3/2021 Mandalapu et al.
10,985,133 B2 4/2021 Uzoh
10,991,804 B2 4/2021 DeLaCruz et al.
10,998,292 B2 5/2021 Lee et al.
11,004,757 B2 5/2021 Katkar et al.
11,011,494 B2 5/2021 Gao et al.
11,011,503 B2 5/2021 Wang et al.
11,031,285 B2 6/2021 Katkar et al.
11,037,919 B2 6/2021 Uzoh et al.
11,056,348 B2 7/2021 Theil
11,069,734 B2 7/2021 Katkar

(56) References Cited

U.S. PATENT DOCUMENTS 11,088,099 B2 8/2021 Katkar et al.
11,127,738 B2 9/2021 DeLaCruz et al.
11,158,573 B2 10/2021 Uzoh et al.
11,158,606 B2 10/2021 Gao et al.
11,164,891 B2 11/2021 Cable et al.
11,169,326 B2 11/2021 Huang et al.
11,171,117 B2 11/2021 Gao et al.
11,176,450 B2 11/2021 Teig et al.
11,195,748 B2 12/2021 Uzoh et al.
11,205,625 B2 12/2021 DeLaCruz et al.
11,244,920 B2 2/2022 Uzoh
11,256,004 B2 2/2022 Haba et al.
11,264,357 B1 3/2022 DeLaCruz et al.
11,276,676 B2 3/2022 Enquist et al.
11,296,044 B2 4/2022 Gao et al.
11,329,034 B2 5/2022 Tao et al.
11,348,801 B2 5/2022 Uzoh et al.
11,348,898 B2 5/2022 DeLaCruz et al.
11,355,443 B2 6/2022 Huang et al.
2002/0003307 A1 1/2002 Suga
2002/0048906 A1 4/2002 Sakai et al.
2002/0056927 A1 5/2002 Ohuchi et al.
2003/0057423 A1 3/2003 Shimoda et al.
2004/0084414 A1 5/2004 Sakai et al.
2004/0241958 A1 12/2004 Guarini et al.
2005/0029224 A1 2/2005 Aspar et al.
2006/0057945 A1 3/2006 Hsu et al.
2006/0264004 A1 11/2006 Tong et al.
2007/0111386 A1 5/2007 Kim et al.
2008/0166525 A1 7/2008 Swinnen et al.
2008/0280416 A1 11/2008 Bedell et al.
2009/0152655 A1 6/2009 Laming et al.
2011/0092051 A1 4/2011 Moriceau et al.
2012/0013013 A1 1/2012 Sadaka et al.
2013/0137244 A1 5/2013 Kramer et al.
2014/0011324 A1 1/2014 Liu et al.
2014/0070378 A1 3/2014 Yamashita
2014/0091458 A1 4/2014 Van Gemert et al.
2014/0094079 A1 4/2014 Ito et al.
2014/0175655 A1 6/2014 Chen et al.
2014/0183728 A1 7/2014 Han et al.
2014/0213039 A1 7/2014 Lee et al.
2014/0273334 A1 9/2014 Christensen et al.
2014/0312511 A1 10/2014 Nakamura et al.
2015/0064498 A1 3/2015 Tong
2015/0091124 A1 4/2015 Liu et al.
2015/0228535 A1 8/2015 Sadaka et al.
2015/0325810 A1 11/2015 Iwase
2015/0348943 A1 12/2015 Chen et al.
2016/0133486 A1 5/2016 Andry et al.
2016/0141260 A1 5/2016 Chang et al.
2016/0163590 A1 6/2016 Jung et al.
2016/0181228 A1 6/2016 Higuchi et al.
2016/0189982 A1 6/2016 Iguchi
2016/0233111 A1 8/2016 Shiota et al.
2016/0326409 A1 11/2016 Tokuyasu et al.
2016/0343682 A1 11/2016 Kawasaki
2016/0343685 A1 11/2016 Lin et al.
2016/0351540 A1 12/2016 Ogiso et al.
2016/0358898 A1 12/2016 Zhou et al.
2017/0004990 A1 1/2017 Kang et al.
2017/0069535 A1 3/2017 Masuko
2017/0092620 A1 3/2017 Haba et al.
2017/0179029 A1 6/2017 Enquist et al.
2017/0200756 A1 7/2017 Kao et al.
2018/0012751 A1 1/2018 Kamochi et al.
2018/0138072 A1 5/2018 Andry et al.
2018/0158713 A1 6/2018 Okita et al.
2018/0175012 A1 6/2018 Wu et al.
2018/0182639 A1 6/2018 Uzoh et al.
2018/0182666 A1 6/2018 Uzoh et al.
2018/0190580 A1 7/2018 Haba et al.
2018/0190583 A1 7/2018 DeLaCruz et al.
2018/0204868 A1 7/2018 Kao et al.
2018/0219038 A1 8/2018 Gambino et al.
2018/0269139 A1 9/2018 Chiang et al.
2018/0294241 A1 10/2018 Chen et al.
2018/0297324 A1 10/2018 Adib et al.
2018/0301365 A1 10/2018 Kilcoyne et al.
2018/0323177 A1 11/2018 Yu et al.
2018/0323227 A1 11/2018 Zhang et al.
2018/0331066 A1 11/2018 Uzoh et al.
2018/0351030 A1 12/2018 Goward
2018/0358261 A1 12/2018 Beche et al.
2019/0088481 A1 3/2019 Budd et al.
2019/0115277 A1 4/2019 Yu et al.
2019/0131277 A1 5/2019 Yang et al.
2019/0198409 A1 6/2019 Katkar et al.
2019/0333550 A1 10/2019 Fisch
2019/0385935 A1 12/2019 Gao et al.
2019/0385966 A1 12/2019 Gao et al.
2020/0013637 A1 1/2020 Haba
2020/0013765 A1 1/2020 Fountain, Jr. et al.
2020/0035641 A1 1/2020 Fountain, Jr. et al.
2020/0075553 A1 3/2020 DeLaCruz et al.
2020/0118973 A1 4/2020 Wang et al.
2020/0227367 A1 7/2020 Haba et al.
2020/0243380 A1 7/2020 Uzoh et al.
2020/0243481 A1 7/2020 Chung et al.
2020/0279821 A1 9/2020 Haba et al.
2020/0294908 A1 9/2020 Haba et al.
2020/0328162 A1 10/2020 Haba et al.
2020/0328164 A1 10/2020 DeLaCruz et al.
2020/0335408 A1 10/2020 Gao et al.
2020/0371154 A1 11/2020 DeLaCruz et al.
2020/0384183 A1 12/2020 Ravenscroft et al.
2020/0388503 A1 12/2020 Uzoh et al.
2020/0395321 A1 12/2020 Katkar et al.
2020/0402960 A1 12/2020 Chen et al.
2020/0411483 A1 12/2020 Uzoh et al.
2021/0098323 A1 4/2021 Yu et al.
2021/0098412 A1 4/2021 Haba et al.
2021/0118864 A1 4/2021 DeLaCruz et al.
2021/0143125 A1 5/2021 DeLaCruz et al.
2021/0181510 A1 6/2021 Katkar et al.
2021/0193603 A1 6/2021 DeLaCruz et al.
2021/0193624 A1 6/2021 DeLaCruz et al.
2021/0193625 A1 6/2021 DeLaCruz et al.
2021/0225795 A1* 7/2021 Otremba ................. H01L 24/29
2021/0233889 A1 7/2021 Mandalapu et al.
2021/0242152 A1 8/2021 Fountain, Jr. et al.
2021/0265523 A1 8/2021 Pan
2021/0296282 A1 9/2021 Gao et al.
2021/0305202 A1 9/2021 Uzoh et al.
2021/0366820 A1 11/2021 Uzoh
2021/0375620 A1 12/2021 Ahmed et al.
2021/0407941 A1 12/2021 Haba
2022/0077063 A1 3/2022 Haba
2022/0077087 A1 3/2022 Haba
2022/0139867 A1 5/2022 Uzoh
2022/0139869 A1 5/2022 Gao et al.
2022/0208650 A1 6/2022 Gao et al.
2022/0208702 A1 6/2022 Uzoh
2022/0208723 A1 6/2022 Katkar et al.
2022/0246497 A1 8/2022 Fountain, Jr. et al.
2022/0285303 A1 9/2022 Mirkarimi et al.
2022/0319901 A1* 10/2022 Suwito .................... H01L 24/00
2022/0320035 A1 10/2022 Uzoh et al.
2022/0320036 A1 10/2022 Gao et al.
2023/0005850 A1 1/2023 Fountain, Jr.
2023/0008039 A1 1/2023 Uzoh et al.
2023/0019869 A1 1/2023 Mirkarimi et al.
2023/0036441 A1 2/2023 Haba et al.
2023/0067677 A1 3/2023 Lee et al.
2023/0069183 A1 3/2023 Haba
2023/0100032 A1 3/2023 Haba et al.
2023/0115122 A1 4/2023 Uzoh et al.
2023/0122531 A1 4/2023 Uzoh
2023/0123423 A1 4/2023 Gao et al.
2023/0125395 A1 4/2023 Gao et al.
2023/0130259 A1 4/2023 Haba et al.
2023/0132632 A1 5/2023 Katkar et al.
2023/0140107 A1 5/2023 Uzoh et al.
2023/0142680 A1 5/2023 Guevara et al.

(56) References Cited

U.S. PATENT DOCUMENTS

| | | | |
|---|---|---|---|
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0420270 A1* | 12/2023 | Kitabatake | H01L 21/568 |

FOREIGN PATENT DOCUMENTS

| | | |
|---|---|---|
| JP | 2002-353416 A | 12/2002 |
| JP | 2003-174153 A | 6/2003 |
| JP | 2006-156972 A | 6/2006 |
| JP | 3 809681 B2 | 8/2006 |
| JP | 2011-003668 A | 1/2011 |
| JP | 2013-033786 A | 2/2013 |
| JP | 2013-534721 A | 9/2013 |
| JP | 2014-508405 A | 4/2014 |
| JP | 2016-506061 A | 2/2016 |
| JP | 2018-160519 | 10/2018 |
| JP | 2020-501359 A | 1/2020 |
| JP | 2020-068253 A | 4/2020 |
| KR | 1999-0067067 A | 8/1999 |
| KR | 10-1128135 | 3/2012 |
| KR | 2015-0037865 A | 4/2015 |
| KR | 20160067517 A | 6/2016 |
| KR | 20210127522 A | 10/2021 |
| TW | 201415583 A | 4/2014 |
| TW | I550735 B | 9/2016 |
| WO | WO 2004/040648 A1 | 5/2004 |
| WO | WO 2005/038865 A2 | 4/2005 |
| WO | WO 2005/043584 A2 | 5/2005 |
| WO | WO 2015/113020 A1 | 7/2015 |
| WO | WO 2015/156381 A1 | 10/2015 |
| WO | WO 2018/102364 A1 | 6/2018 |
| WO | WO 2018/135241 A1 | 7/2018 |
| WO | WO 2021/238681 A1 | 12/2021 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

International Search Report and Written Opinion for PCT/US2022/081864, mailed May 9, 2023, 14 pages.

Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.

Monk et al., "Hydrofluoric etching of silicon dioxide sacrificial layers," J. ElectroChem. Soc., 1994, vol. 141, pp. 270-274.

Moriceau, H. et al., "Overview of recent direct wafer bonding advances and applications," Advances in Natural Sciences—Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Photo-polymer mass transfer, Terecircuits webpage, www.terecircuits.com/process, downloaded Aug. 23, 2022, 4 pages.

Plobi, A. et al., "Wafer direct bonding: tailoring adhesion between brittle materials," Materials Science and Engineering Review Journal, 1999, R25, 88 pages.

Smart cut, Wikipedia entry, https://en.wikipedia.org/wiki/Smart_cut, 2 sheets.

SONY IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "SONY IMX260."

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Theil, Jeremy A., "Fluorinated amorphous carbon films for low permittivity interlevel dielectrics," J. Vac. Sci. Technol. B, Nov./Dec. 1999, vol. 17, No. 6, pp. 2397-2410.

Theil, Jeremy A. et al., "The effect of thermal cycling on a-C:F,H low dielectric constant films deposited by ECR plasma enhanced chemical vapor deposition," Appears in the Proceedings of the International Interconnect Technology Conference (IITC), 1998, pp. 128-130.

Theil, Jeremy A. et al, "Thermal stability of a-C:F,H films deposited by electron cyclotron resonance plasma enhanced chemical vapor deposition," Presented at Symposium N of the Spring 1997 MRS Meeting, 1997, 6 pages.

3M Science., "Temporary bonding and debonding for advanced packaging". (2021); downloaded on Aug. 22, 2025 from https://www.3m.com/3M/en_US/semiconductor-us/solutions/advancedpackaging/advancedpackaging-tbdb/, 8 pages.

Bedjaoui et al., "Direct bonding and debonding approach of ultrathin glass substrates for high temperature devices." In 2017 IEEE 67th Electronic Components and Technology Conference (ECTC) May 30, 2017 (pp. 725-732).

Park H.L., International Preliminary Report on Patentability for PCT/US2022/022674, dated Jul. 25, 2022 (7 pages).

European Supplemental Search Report, re EP App. No. 22912611.5, dated Dec. 3, 2025, 18 pages.

European Extended Search Report, re EP App. No. 22912611.5, dated Apr. 9, 2026, 19 pages.

* cited by examiner 20
24a
22
24
26
22
12
24
18
10
18a
12
18
16
14

DIRECT BONDING AND DEBONDING OF ELEMENTS

CROSS-REFERENCE TO RELATED APPLICATIONS

This application claims priority to U.S. Provisional Patent Application No. 63/265,761, filed Dec. 20, 2021, titled "DIRECT BONDING AND DEBONDING OF ELEMENTS," the entire contents of each of which are hereby incorporated herein by reference.

BACKGROUND

Field

The field relates to direct bonding of a semiconductor element to a carrier, removing the carrier from the semiconductor element after the direct bonding, and structures therefor.

Description of the Related Art

In some applications, semiconductor elements (such as wafers and dies) are temporarily bonded to carriers for intermediate processing. However, it can be challenging to process (e.g., thin or conduct backside processing using conventional temporary bonding materials (adhesives). Accordingly, there remains a continuing need for improved methods and structures for temporary bonding.

BRIEF DESCRIPTION OF THE DRAWINGS

Specific implementations will now be described with reference to the following drawings, which are provided by way of example, and not limitation.

DETAILED DESCRIPTION

Embodiments described herein can combine direct bonding or hybrid direct bonding techniques with temporary bonding layers that are configured to release or debond the directly bonded elements.

Figure 1A:
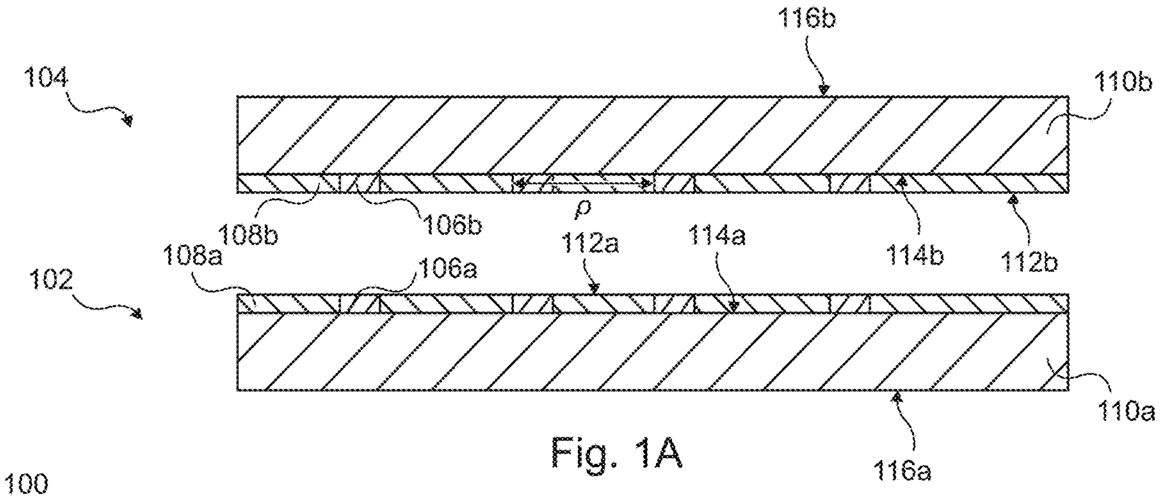
FIG. 1A is a schematic cross-sectional side view of two elements prior to direct hybrid bonding.
Figure 1B:
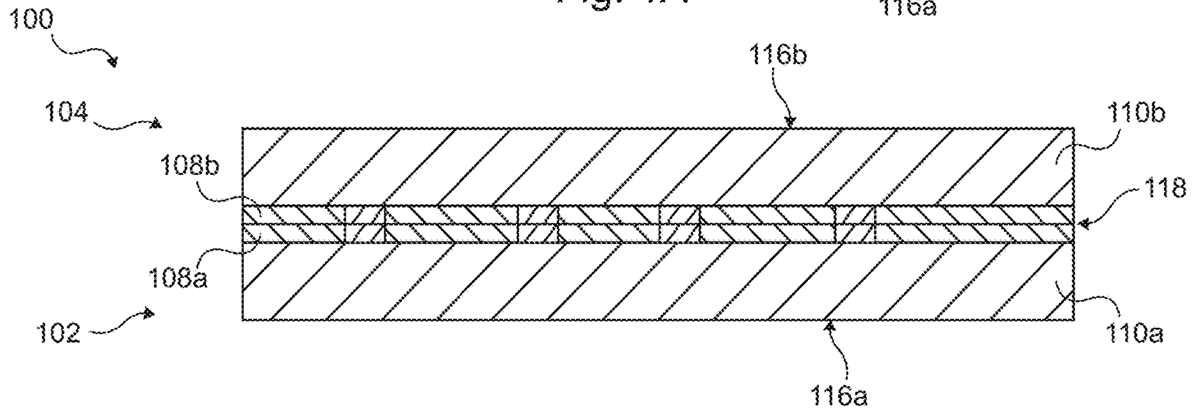
FIG. 1B is a schematic cross-sectional side view of the two elements shown in FIG. 1A after direct hybrid bonding.

Various embodiments disclosed herein relate to directly bonded structures in which two or more elements can be directly bonded to one another without an intervening adhesive. FIGS. 1A and 1B schematically illustrate a process for forming a directly hybrid bonded structure without an intervening adhesive according to some embodiments. In FIGS. 1A and 1B, a bonded structure 100 comprises two elements 102 and 104 that can be directly bonded to one another at a bond interface 118 without an intervening adhesive. Two or more microelectronic elements 102 and 104 (such as semiconductor elements, including, for example, integrated device dies, wafers, passive devices, individual active devices such as power switches, etc.) may be stacked on or bonded to one another to form the bonded structure 100. Conductive features 106*a* (e.g., contact pads, exposed ends of vias (e.g., TSVs), or a through substrate electrodes) of a first element 102 may be electrically connected to corresponding conductive features 106*b* of a second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive field region that includes a non-conductive or dielectric material can serve as a first bonding layer 108*a* of the first element 102 which can be directly bonded to a corresponding non-conductive field region that includes a non-conductive or dielectric material serving as a second bonding layer 108*b* of the second element 104 without an adhesive. The non-conductive bonding layers 108*a* and 108*b* can be disposed on respective front sides 114*a* and 114*b* of device portions 110*a* and 110*b*, such as a semiconductor (e.g., silicon) portion of the elements 102, 103. Active devices and/or circuitry can be patterned and/or otherwise disposed in or on the device portions 110*a* and 110*b*. Active devices and/or circuitry can be disposed at or near the front sides 114*a* and 114*b* of the device portions 110*a* and 110*b*, and/or at or near opposite backsides 116*a* and 116*b* of the device portions 110*a* and 110*b*. Bonding layers can be provided on front sides and/or back sides of the elements. The non-conductive material can be referred to as a non-conductive bonding region or bonding layer 108*a* of the first element 102. In some embodiments, the non-conductive bonding layer 108*a* of the first element 102 can be directly bonded to the corresponding non-conductive bonding layer 108*b* of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108*a* and/or 108*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials do not comprise polymer materials, such as epoxy, resin or molding materials.

In some embodiments, the device portions 110*a* and 110*b* can have a significantly different coefficients of thermal expansion (CTEs) defining a heterogenous structure. The CTE difference between the device portions 110*a* and 110*b*, and particularly between bulk semiconductor, typically single crystal portions of the device portions 110*a*, 110*b*, can be greater than 5 ppm or greater than 10 ppm. For example, the CTE difference between the device portions 110*a* and 110*b* can be in a range of 5 ppm to 100 ppm, 5 ppm to 40 ppm, 10 ppm to 100 ppm, or 10 ppm to 40 ppm. In some embodiments, one of the device portions 110*a* and 110*b* can comprise optoelectronic single crystal materials, including perovskite materials, that are useful for optical piezoelectric or pyroelectric applications, and the other of the device portions 110*a*, 110*b* comprises a more conventional substrate material. For example, one of the device portions 110*a*, 110*b* comprises lithium tantalate ($LiTaO_3$) or lithium niobate ($LiNbO_3$), and the other one of the device portions 110*a*, 110*b* comprises silicon (Si), quartz, fused silica glass, sapphire, or a glass. In other embodiments, one of the device portions 110*a* and 110*b* comprises a III-V single semiconductor material, such as gallium arsenide (GaAs) or gallium nitride (GaN), and the other one of the device portions 110*a* and 110*b* can comprise a non-III-V semiconductor material, such as silicon (Si), or can comprise other materials with similar CTE, such as quartz, fused silica glass, sapphire, or a glass.

In various embodiments, direct hybrid bonds can be formed without an intervening adhesive. For example, non-conductive bonding surfaces 112*a* and 112*b* can be polished to a high degree of smoothness. The bonding surfaces 112*a* and 112*b* can be cleaned and exposed to a plasma and/or etchants to activate the surfaces 112*a* and 112*b*. In some embodiments, the surfaces 112*a* and 112*b* can be terminated with a species after activation or during activation (e.g., during the plasma and/or etch processes). Without being limited by theory, in some embodiments, the activation process can be performed to break chemical bonds at the bonding surfaces 112*a* and 112*b*, and the termination process can provide additional chemical species at the bonding surfaces 112*a* and 112*b* that improves the bonding energy during direct bonding. In some embodiments, the activation and termination are provided in the same step, e.g., a plasma to activate and terminate the surfaces 112*a* and 112*b*. In other embodiments, the bonding surfaces 112*a* and 112*b* can be terminated in a separate treatment to provide the additional species for direct bonding. In various embodiments, the terminating species can comprise nitrogen. For example, in some embodiments, the bonding surface(s) 112*a*, 112*b* can be exposed to a nitrogen-containing plasma. Further, in some embodiments, the bonding surfaces 112*a* and 112*b* can be exposed to fluorine. For example, there may be one or multiple fluorine peaks at or near a bond interface 118 between the first and second elements 102, 104. Thus, in the directly bonded structure 100, the bond interface 118 between two non-conductive materials (e.g., the bonding layers 108*a* and 108*b*) can comprise a very smooth interface with higher nitrogen content and/or fluorine peaks at the bond interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features 106*a* of the first element 102 can also be directly bonded to corresponding conductive features 106*b* of the second element 104. For example, a direct hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106*a* to conductive feature 106*b*) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. In direct hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces 112*a*, 112*b* (for example, inorganic dielectric surfaces) can be prepared and directly bonded to one another without an intervening adhesive as explained above. Conductive contact features (e.g., conductive features 106*a* and 106*b* which may be at least partially surrounded by non-conductive dielectric field regions within the bonding layers 108*a*, 108*b*) may also directly bond to one another without an intervening adhesive. In various embodiments, the conductive features 106*a*, 106*b* can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 106*a* and 106*b* can be recessed below exterior (e.g., upper) surfaces (non-conductive bonding surfaces 112*a* and 112*b*) of the dielectric field region or non-conductive bonding layers 108*a* and 108*b*, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108*a* and 108*b* can be directly bonded to one another without an adhesive at room temperature in some embodiments and, subsequently, the bonded structure 100 can be annealed. Upon annealing, the conductive features 106*a* and 106*b* can expand and contact one another to form a metal-to-metal direct bond. Beneficially, the use of Direct Bond Interconnect, or DBI®, techniques commercially available from Adeia of San Jose, CA, can enable high density of conductive features 106*a* and 106*b* to be connected across the direct bond interface 118 (e.g., small or fine pitches for regular arrays). In some embodiments, the pitch of the conductive features 106*a* and 106*b*, such as conductive traces embedded in the bonding surface of one of the bonded elements, may be less than 100 microns or less than 10 microns or even less than 2 microns. For some applications, the ratio of the pitch of the conductive features 106*a* and 106*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 106*a* and 106*b* and/or traces can comprise copper or copper alloys, although other metals may be suitable. For example, the conductive features disclosed herein, such as the conductive features 106*a* and 106*b*, can comprise fine-grain metal (e.g., a fine-grain copper).

Thus, in direct bonding processes, a first element 102 can be directly bonded to a second element 104 without an intervening adhesive. In some arrangements, the first element 102 can comprise a singulated element, such as a singulated integrated device die. In other arrangements, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die. In other arrangements, the second element 104 can comprise a carrier or substrate (e.g., a wafer). The embodiments disclosed herein can accordingly apply to wafer-to-wafer (W2W), die-to-die (D2D), or die-to-wafer (D2W) bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 102 and 104 can be directly bonded to one another without an adhesive, which is different from a deposition process and results in a structurally different interface compared to a deposition. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112*a* and 112*b* (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108*a* and 108*b* can also comprise polished surfaces that are planarized to a high degree of smoothness.

In various embodiments, the metal-to-metal bonds between the conductive features 106*a* and 106*b* can be joined such that metal grains grow into each other across the bond interface 118. In some embodiments, the metal is or includes copper, which can have grains oriented along the 111 crystal plane for improved copper diffusion across the bond interface 118. In some embodiments, the conductive features 106*a* and 106*b* may include nanotwinned copper grain structure, which can aid in merging the conductive features during anneal. The bond interface 118 can extend substantially entirely to at least a portion of the bonded conductive features 106*a* and 106*b*, such that there is substantially no gap between the non-conductive bonding layers 108*a* and 108*b* at or near the bonded conductive features 106*a* and 106*b*. In some embodiments, a barrier layer may be provided under and/or laterally surrounding the conductive features 106*a* and 106*b* (e.g., which may include copper). In other embodiments, however, there may be no barrier layer under the conductive features 106*a* and 106*b*, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 106*a* and 106*b*, and/or small pad sizes. For example, in various embodiments, the pitch p (i.e., the distance from edge-to-edge or center-to-center, as shown in FIG. 1A) between adjacent conductive features 106*a* (or 106*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 108*a*, 108*b* can be directly bonded to one another without an adhesive and, subsequently, the bonded structure 100 can be annealed. Upon annealing, the conductive features 106*a*, 106*b* can expand and contact one another to form a metal-to-metal direct bond. In some embodiments, the materials of the conductive features 106*a*, 106*b* can interdiffuse during the annealing process.

In some applications, it may be desirable to utilize thinned semiconductor elements, for example, in multi-element device stacks, such as memory devices. For example, a semiconductor element (such as a semiconductor device wafer) can be temporarily bonded to a carrier (e.g., a glass or silicon carrier wafer) by way of an adhesive (e.g., a polymer film or an organic adhesive), such as a heat curable or UV curable adhesive. The backside of the semiconductor element can be thinned by, for example, grinding and/or chemical mechanical polishing (CMP). Moreover, additional backside processing may be performed on the backside of the semiconductor element with the semiconductor element adhered to the carrier. For example, metallization or back-end-of-line (BEOL) layers may be deposited or otherwise provided on the thinned semiconductor element.

However, the use of adhesives in temporary bonds can be challenging in a number of respects. For example, as the device wafer is thinned, the residual stress from the BEOL film as well as any thermal processing may cause lateral expansion of the die size because the organic adhesive may not provide a sufficient bond strength to constrain the lateral growth of the device wafer. Furthermore, the mechanical stability of the adhesive bond between the device wafer and the carrier wafer during the thinning process (e.g., a grinding process) may deteriorate or become unreliable due to the forces imparted during thinning. The adhesive may have thickness non-uniformity or uneven thickness along a bonding surface. In some cases, the thinning process may also cause the thickness of the device wafer to vary significantly so as to exceed a desired total thickness variation (TTV). For example, the intervening temporary adhesive between the device wafer and the carrier wafer can have non-uniformities that can result in excessive thickness variation upon thinning. Moreover, the temporary adhesive bond may not have sufficient thermal and/or chemical stability when exposed to various processes. For example, the temporary adhesive may degrade when exposed to the chemicals used for wafer cleaning, electrochemical deposition (ECD), and/or CMP. The adhesive may alternatively or additionally decompose during deposition and/or etch processes (such as chemical vapor deposition (CVD), plasma-enhanced CVD, physical vapor deposition, etc.). For another example, the organic adhesive may have relatively low thermal conductivity. In addition, when the carrier and adhesive are removed from the device wafer, the device wafer may include residue from the adhesive, which may cause the use of an extra cleaning step. Accordingly, there remains a continuing need for improved methods and structures for temporarily bonding elements for processing (e.g., thinning) the element.

Figures 2A, 2B, 2C, 2D, 2E:
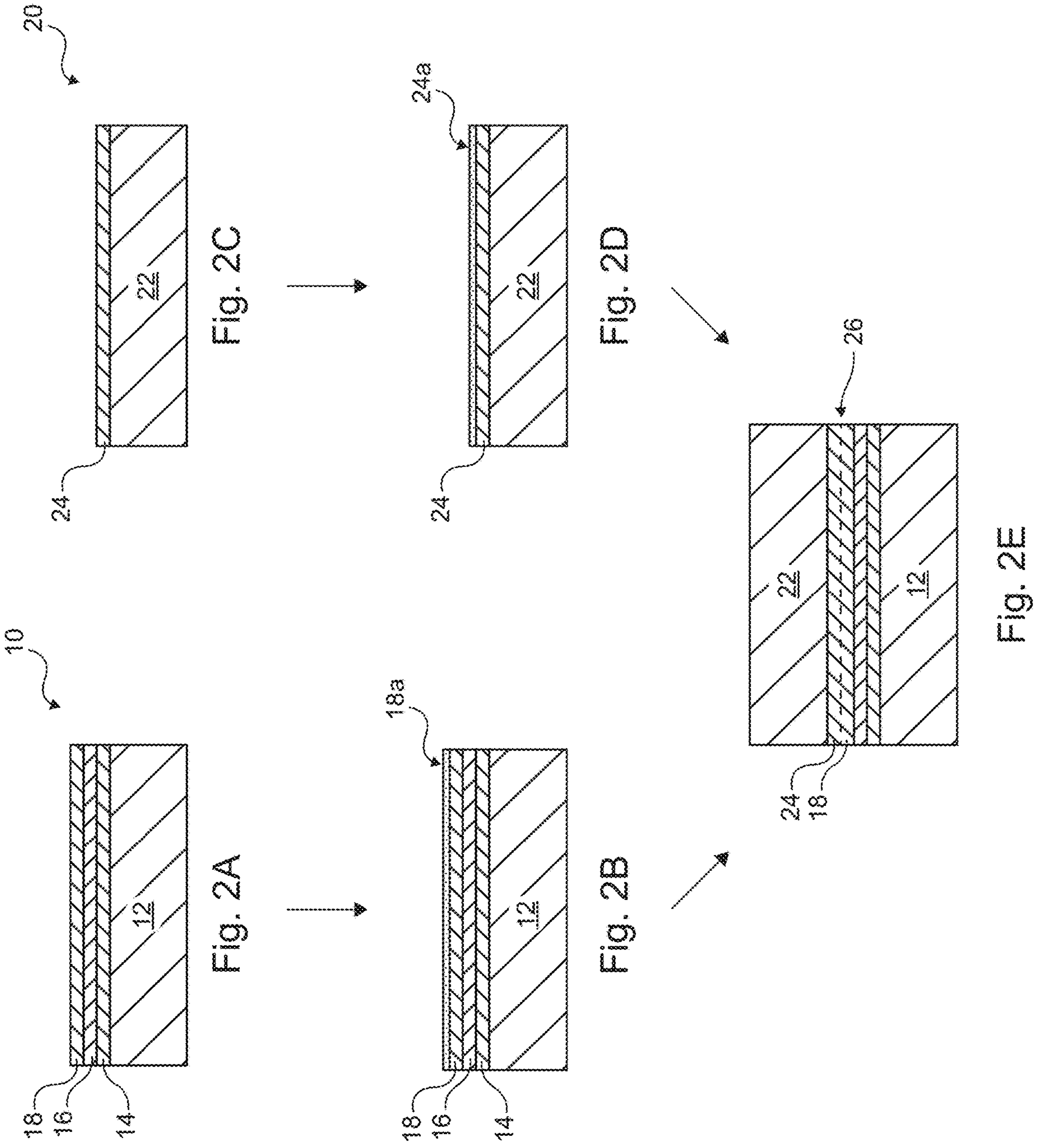
FIG. 2A is a schematic cross-sectional side view of a carrier.
FIG. 2B is a schematic cross-sectional side view of the carrier after being prepared for direct bonding.
FIG. 2C is a schematic cross-sectional side view of a semiconductor element with a bonding layer.
FIG. 2D is a schematic cross-sectional side view of the semiconductor element with the bonding layer after being prepared for direct bonding.
FIG. 2E is a schematic cross-sectional side view of a bonded structure.

FIGS. 2A-2E illustrate a bonding method and FIGS. 2F-2I illustrate a de-bonding or releasing method according to various embodiments. The bonding method and the de-bonding method can be performed in sequence to form a processed (e.g., thinned) element. FIG. 2A is a schematic cross-sectional side view of a first element (e.g., a carrier 10). The carrier 10 can comprise an intervening layer 14, which may be an inorganic layer such as a silicon oxide, on the substrate 12, a release layer 16 on the intervening layer 14, and a bonding layer 18, which can also be a dielectric layer such as a silicon oxide layer, on the release layer 16. In the illustrated embodiment, the release layer 16 is prepared with the carrier 10. However, in some other embodiments, the release layer 16 can be prepared with a semiconductor element 20 on a device portion 22 at FIG. 2C (see FIGS. 6A-6I). In some embodiments, the substrate 12 can comprise a wafer. The substrate 12 can comprise any suitable material such as glass, low-doped silicon, etc. In some embodiments, the substrate 12 can comprise a bulk carrier portion. Each of the intervening layer 14 and the bonding layer 18 can comprise a non-conductive material, such as the materials noted above as suitable for direct bonding, including but not limited to silicon, silicon oxide, silicon nitride, silicon oxynitride, silicon carbide, silicon oxycarbide, silicon oxycarbonitride, etc. The intervening layer 14 can be thin. For example, the intervening layer 14 can be in a range between 50 nm and 500 nm, or 100 nm and 200 nm. The intervening layer 14 may serve an adhesion function between the release layer 16 and the substrate 12. If neither barrier function nor adhesion functions are called for, for example with a sacrificial or non-active carrier such as a glass substrate, the intervening layer 14 can be omitted.

The release layer 16 can comprise a material that is configured to outgas in response to application of thermal energy. In some embodiments, the release layer 16 can outgas in response to heating or radiating. For example, the release layer 16 can be configured to outgas in response to radiant heating, laser rastering, rapid thermal annealing, thermal annealing, or microwave heating. In some embodiments, the release layer 16 can comprise a carbon-containing layer, such as a primarily carbon layer. The release layer 16 can comprise amorphous carbon that includes contaminants. The contaminants can include species that can become volatile and evolve as gas upon absorption of energy. In some embodiments, the volatile species include hydrogen. In some embodiments, the volatile species include a halogen, such as chlorine or fluorine. The contaminants can also include species that do not evolve gas, in addition to the volatile species.

In some embodiments, the release layer 16 can comprise amorphous carbon with hydrogen and fluorine. The release layer 16 can include volatilizable constituents sufficient to allow mechanical release upon absorption of energy, but has a composition that is mechanically sound for supporting subsequent processing as described herein. In some embodiments, hydrogen and fluorine can represent between about 10 wt. % and 85 wt. % of the release layer 16, more particularly between about 30 wt. % and 65 wt. %.

The release layer 16 can be deposited on the intervening layer 14. For example, the release layer 16 can be deposited by way of chemical vapor deposition (CVD), and more particularly by plasma-enhanced CVD (PECVD), or physical vapor deposition (PVD). The release layer 16 can have a thickness in a range of, for example, 10 nm to 3 μm, from 10 nm to 500 nm, or more particularly in a range of, for example, 200 nm to 500 nm. In other embodiments, the release layer can have a thickness from about 500 nm to 1 μm. In general, the thickness can be selected to generate sufficient outgassing to allow physical separation and can be readily deposited with available equipment. Because one of the functions of the release layer 16 can be to absorb thermal energy in order to release gases, a thicker layer may be advisable if thickness uniformity can be maintained. The thickness of the release layer 16 can have a thickness uniformity less than, for example, 3%, or less than, for example, 1.5%.

Providing the release layer 16 by PECVD advantageously enables deposition at low temperatures and tuning deposition parameters to tune the release gas(es) content of the release layer 16. For example, PECVD of an α-C:H, F layer can employ hydrocarbon and/or hydrofluorocarbon precursors (e.g., $CHF_3$, $CH_4$, $CF_4$, $C_2H_6$, $C_3F_6$, $C_4F_8$, $C_6F_6$, $C_6H_5F$, HFPO, $SF_6$, $NF_3$, $H_2$, $N_2$, He, Ar, $CH_4$, $C_2H_2$, $C_6H_6$, etc.) and inert gas. Other alkanes that are partially or fully fluorinated and can be readily delivered into the vacuum chamber in the gas phase may also be employed. Further, alkene analogues material may be employed. Among other parameters, deposition temperature, plasma power and pressure can be tuned to tune the hydrogen and/or fluorine content. Desirably, the content is sufficient to allow volatilizing between 10% and 95% of the film thickness, more particularly between 50% and 90% of the film thickness, upon heating as described below. At the same time, an α-C:H, F (originally developed for low k applications in semiconductor interconnect layers) can be robust enough to withstand the desired processing of the temporarily bonded structure, and provide a sufficiently uniform thickness to provide a flat overlying bonding layer 18. Particular settings will of course depend upon the tool being employed for the deposition. One non-limiting example is the use of an ECR plasma at 2 mTorr and 600 W of applied plasma-generating power. Deposition temperatures can be, for example, 50° C. to 300° C., desirably less than 200° C. The deposition temperature for providing the release layer 16 is lower than a release temperature for releasing the release layer 16. Advantageously, no post-deposition anneal is performed to avoid loss of hydrogen and fluorine content.

At FIG. 2B, after depositing the bonding layer 18 over the release layer, the bonding layer 18 can be prepared for direct bonding. A bonding surface of the bonding layer 18 can be polished to a high degree of smoothness. For example, the bonding surface can be polished to a root-mean-square (rms) surface roughness of less than 2 nm, e.g., less than 1 nm, less than 0.5 nm, etc. The bonding surface can be cleaned and exposed to a plasma and/or etchants to activate the bonding surface thereby at least partially defining a prepared surface 18*a*. In some embodiments, the bonding surface can be terminated with a species that enhances direct bonding strength for the non-conductive bonding layers after activation or during activation (e.g., during the plasma and/or etch processes).

FIG. 2C is a schematic cross-sectional side view of a second element, in this case a semiconductor element 20 with a bonding layer 24. Like the bonding layer 18 of the carrier 10, the bonding layer 24 of the second element can comprise an inorganic, non-conductive material, such as silicon, silicon oxide, silicon nitride, silicon oxynitride, silicon carbide, silicon oxycarbide, silicon oxycarbonitride, etc. The semiconductor element 20 can comprise a semiconductor device element in wafer form or as a singulated integrated device die. The semiconductor element 20 can comprise a device portion 22 having active circuitry and/or devices therein. As described above, in some other embodiments, the release layer 16 can be prepared with the semiconductor element 20, instead of preparing the release layer 16 with the carrier 10.

At FIG. 2D, the bonding dielectric layer 24 can be prepared for direct bonding. A bonding surface of the bonding dielectric layer 24 can be polished to a high degree of smoothness. For example, the bonding surface can be polished to a root-mean-square (rms) surface roughness of less than 2 nm, e.g., less than 1 nm, less than 0.5 nm, etc. The bonding surface can be cleaned and exposed to a plasma and/or etchants to activate the bonding surface thereby at least partially defining a prepared surface 24*a*. In some embodiments, the bonding surface can be terminated with a species after activation or during activation (e.g., during the plasma and/or etch processes).

At FIG. 2E, the semiconductor element 20 can be bonded to the carrier 10. The prepared surface 24*a* of the semiconductor element 20 and the prepared surface 18*a* of the carrier 10 can be directly bonded to one another without an intervening adhesive along a bonding interface 26. As described above, direct bonding can be conducted at room temperature and without externally applied pressure (apart from, for example, a light directed touch to initiate bond front propagation), with or without subsequent annealing to strengthen the direct bond.

Figures 2F, 2G, 2H, 2I:
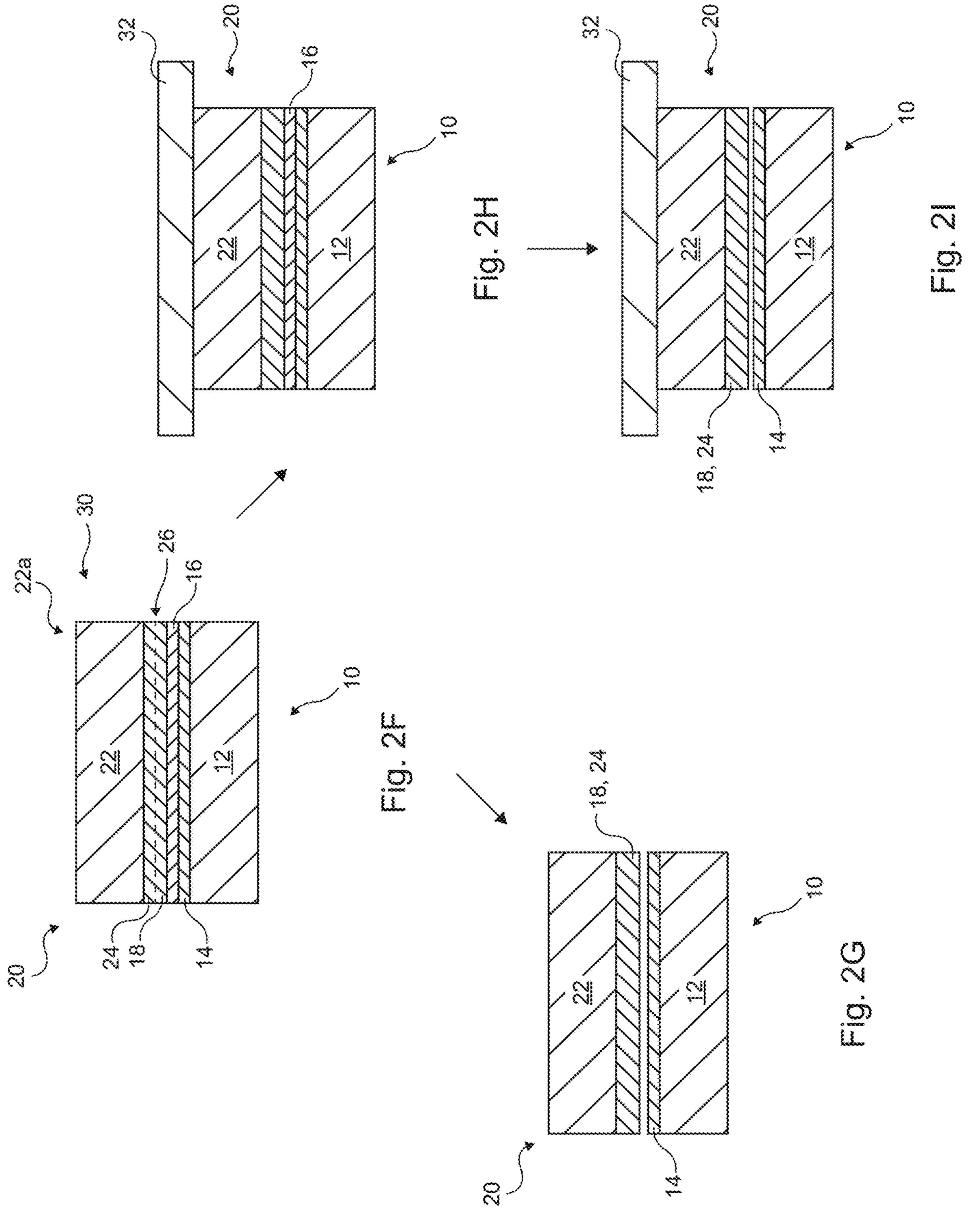
FIG. 2F is a schematic cross-sectional side view of the bonded structure of FIG. 2E reproduced for illustration purposes.
FIG. 2G is a schematic cross-sectional side view of the carrier and the semiconductor element after de-bonding.
FIG. 2H is a schematic cross-sectional side view of the carrier and the semiconductor element on a debond tape.
FIG. 2I is a schematic cross-sectional side view of the carrier and the semiconductor element after de-bonding.

FIG. 2F is a schematic cross-sectional side view of a bonded structure 30 formed in FIG. 2E. The bonded structure 30 includes the semiconductor element 20 that is directly bonded to the carrier 10. The device portion 22 of the semiconductor element 20 can be processed. In some embodiments, the device portion 22 of the semiconductor element 20 can be thinned or otherwise processed (e.g., by addition of BEOL layers) while in the bonded structure 30. For example, a backside 22*a* of the device portion 22 can be thinned by way of grinding and/or chemical mechanical polishing (CMP). Other processing at this stage can include robotic transfer and bonding the backside of the semiconductor element 20 to a third element (not shown).

At FIG. 2G, after any processing, the carrier 10 of the bonded structure 30 can be removed from the semiconductor element 20 by transferring thermal energy to the release layer 16 to thereby induce diffusion of gas out of the release layer 16. In some embodiments, the release layer 16 can outgas hydrogen and/or fluorine. The thermal energy can be transferred to the release layer 16 by, for example, radiating, laser rastering, thermal annealing, rapid thermal annealing, microwave heating, etc. When radiant heat or laser raster is used for transferring thermal energy to the release layer 16, the substrate 12 can comprise a material that is transparent to the light. The laser or radiant heating light can irradiate the release layer 16 through the substrate 12 thereby heating the release layer 16 to cause outgassing. In some embodiments, the release layer 16 can be locally heated. In some other embodiments, the entire bonded structure 30 can be heated. In some embodiments, the thermal energy can heat the release layer 16 to a temperature of about 100° C. to 400° C., particularly about 200° C. to 250° C. In some embodiments, the temperature for heating the release layer 16 can be at least 50° C. higher than the deposition temperature used for depositing the release layer 16.

An amount of gas released from the release layer 16 can be controlled. In some embodiments, the temperature applied to the release layer 16 can be controlled to change the amount of gas released from the release layer 16. In some embodiments, amount of the gaseous elements incorporated in the release layer 16 can be modulated by controlling the deposition process of the release layer 16 to change the amount of gas released from the release layer 16 upon heating. For example, the amount of volatile gases within the release layer 16 can be adjusted by adjusting a fluorine and/or hydrogen content in the release layer 16, such as by control of the plasma power, substrate bias, precursor flow rate, pressure and/or substrate temperature in a release layer deposition process.

Alternatively, at FIG. 2H, a debond tape 32 or other element can be attached to the substrate 12 prior to removing the carrier 10 from the semiconductor element 20. In some embodiments, the debond tape 32 can comprise a dicing tape.

At FIG. 2I, the carrier 10 of the bonded structure 30 can be removed from the semiconductor element 20 by transferring thermal energy to the release layer 16 to thereby induce diffusion of gas out of the release layer 16.

In some embodiments, after the carrier 10 is removed from the semiconductor element 20, a surface of the semiconductor element 20 can be ashed to clean residues of the release layer 16. Though the release layer 16 is provided with the carrier 10 in the illustrated embodiments, in various embodiments, the release layer 16 can alternatively be provided with the semiconductor element 20 (see FIGS. 6A-6E). Also, in various embodiments, the carrier 10 can comprise a semiconductor element, and two semiconductor elements can be directly bonded and de-bonded.

After processing the semiconductor element 20, the semiconductor element 20 can be bonded to another element (not shown). In some embodiments, the semiconductor element 20 can be directly bonded to another element without an intervening adhesive. For example, the semiconductor element 20 and the other element can be directly bonded to one another in a manner described with respect to FIGS. 1A and 1B. For example, the semiconductor element 20 can comprise the first element 102 and the other element can comprise the second element 104 of FIGS. 1A and 1B.

Figure 3:
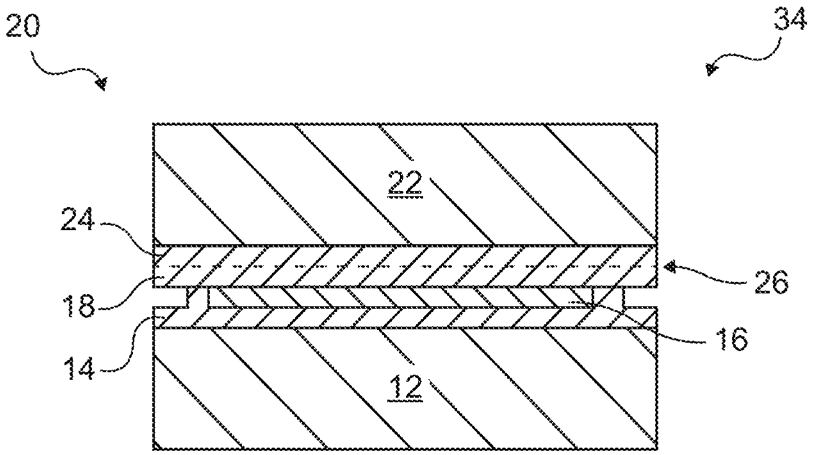
FIG. 3 is a schematic cross-sectional side view of a bonded structure according to an embodiment.

FIG. 3 is a schematic cross-sectional side view of a bonded structure 34 according to an embodiment. Unless otherwise noted, the components of FIG. 3 may be similar to or the same as like components of FIGS. 1A to 2I. The release layer 16 can have a footprint that is smaller than a footprint of the substrate 12 or the intervening layer 14 of the carrier 10. The footprint of the release layer 16 can be sized to provide sufficient bonding strength for processing (thinning) the semiconductor element 20, and for release of the elements upon outgassing. In some embodiments, side edges of the release layer 16 can be covered by the material of the intervening layer 14 or the bonding layer 18. The intervening layer 14 or the bonding layer 18 can protect the side edges of the release layer 16 from chemicals used in intervening process steps before releasing the release layer 16.

Figure 4:
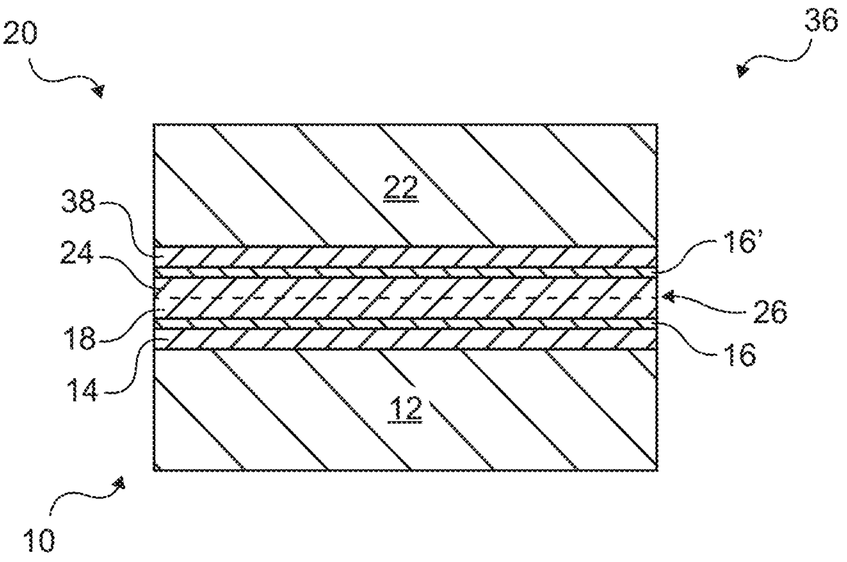
FIG. 4 is a schematic cross-sectional side view of a bonded structure according to another embodiment.

FIG. 4 is a schematic cross-sectional side view of a bonded structure 36 according to an embodiment. Unless otherwise noted, the components of FIG. 4 may be similar to or the same as like components of FIGS. 1A to 3. The bonded structure 36 can include two release layers (a first release layer 16 and a second release layer 16'). In some embodiments, the first layer 16 can be provided with the carrier 10, and the second release layer 16' can be provided with the semiconductor element 20. For example, the semiconductor element 20 can comprise the device portion 22, an intervening layer 38 on the device portion 22, the second release layer 16' on the intervening layer 38, and the bonding layer 24 on the second release layer 16', and the carrier 10 can comprise the substrate 12, the intervening layer 14 on the substrate 12, the first release layer 16 over the intervening layer 14, and the bonding layer 18 over the intervening layer 14. The bonding layers 18, 24 can be bonded along the bonding interface 26 as shown in FIG. 4.

In some embodiments, the first release layer 16 and the second release layer 16' can comprise the same material or different materials. For example, the first release layer 16 and the second release layer 16' can comprise different ratios of fluorine and/or hydrogen. By having different release layers for the first and second release layers 16, 16', temperatures at which the first and second release layers 16, 16' outgas can be controlled.

Figures 5A, 5B:
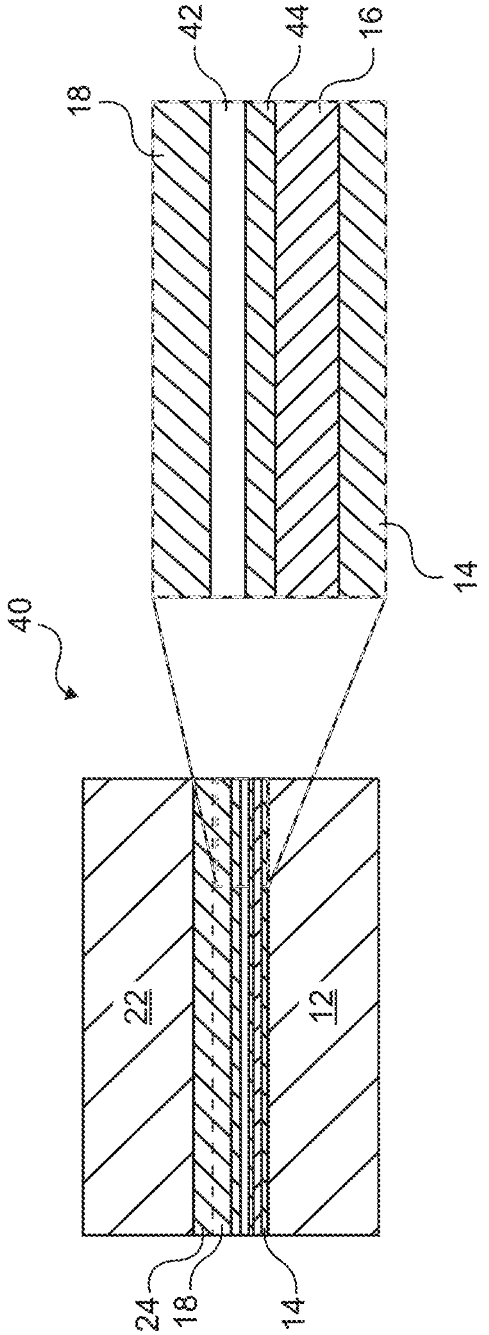
FIG. 5A is a schematic cross-sectional side view of a bonded structure according to another embodiment.
FIG. 5B is an enlarged view of a portion of the bonded structure shown in FIG. 5A.
Figures 6A, 6B, 6C, 6D, 6E:
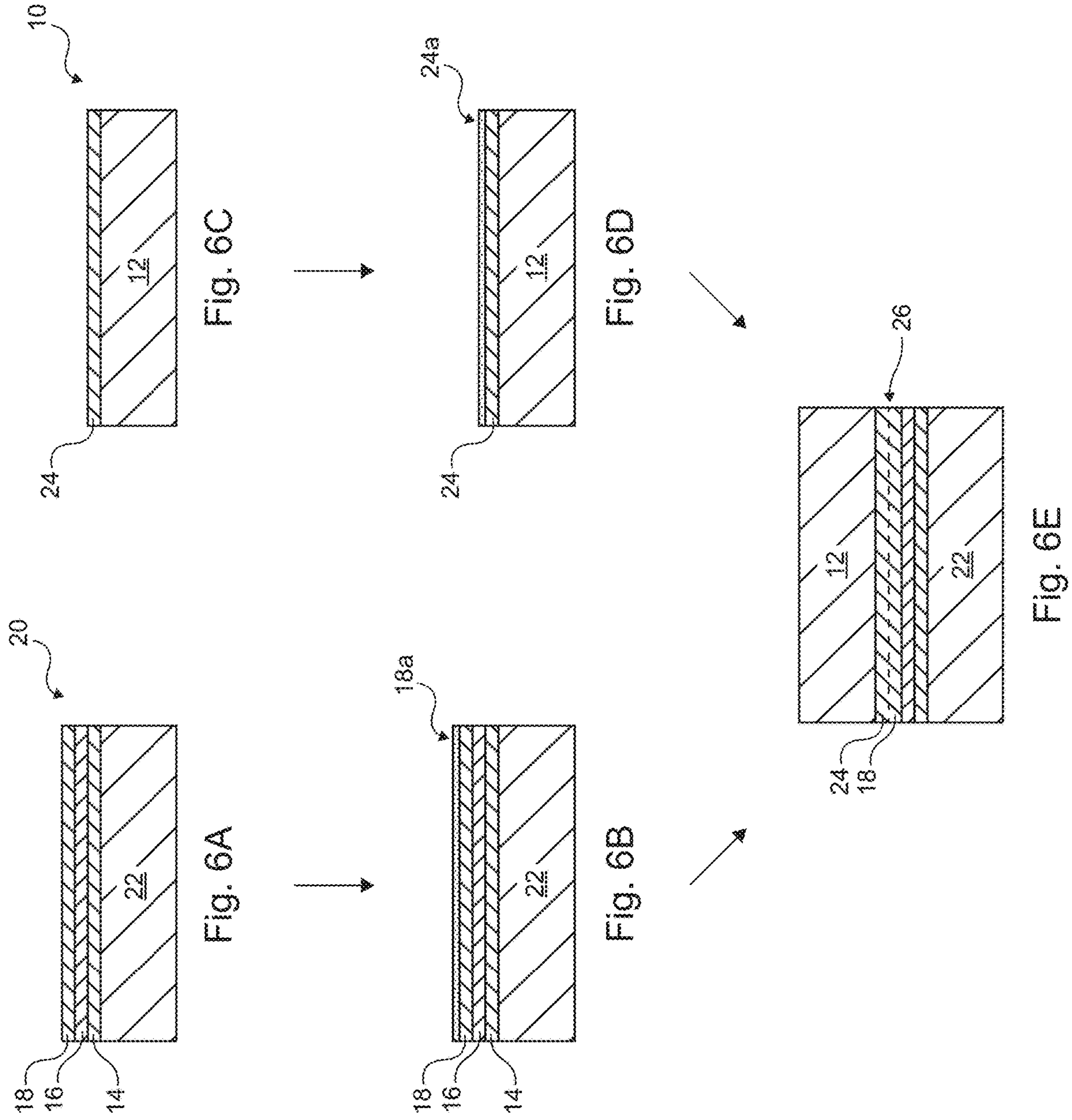
FIG. 6A is a schematic cross-sectional side view of a semiconductor element with a bonding layer.
FIG. 6B is a schematic cross-sectional side view of the semiconductor element with the bonding layer after being prepared for direct bonding.
FIG. 6C is a schematic cross-sectional side view of a carrier.
FIG. 6D is a schematic cross-sectional side view of the carrier after being prepared for direct bonding.
FIG. 6E is a schematic cross-sectional side view of a bonded structure.

FIG. 5A is a schematic cross-sectional side view of a bonded structure 40 according to an embodiment. FIG. 5B is an enlarged view of a portion of the bonded structure 40 shown in FIG. 5A. Unless otherwise noted, the components of FIGS. 5A and 5B may be similar to or the same as like components of FIGS. 1A to 4. The bonded structure 40 can include a reflective layer 42 and a dielectric layer 44 disposed between the reflective layer 42 and the substrate 12. The reflective layer 42 can be beneficial when radiant energy (e.g., laser rastering) is used to induce diffusion of gas from the release layer 16. For example, laser light can reach the release layer 16 through the substrate 12 and some of the laser light can pass through the release layer 16. The reflective layer 42 can reflect the laser light that passed through the release layer 16 back to the release layer 16 there my enhancing or maximizing transfer of energy from the laser light source to the release layer 16. In some embodiments, the reflective layer 42 can comprise a reflective metal that is reflective against a wavelength of the radiant energy. Therefore, the reflective layer 42 can reflect the laser light back into the release layer 16 to facilitate the decomposition. In some embodiments, the reflective layer 42 can be partially transparent.

In FIGS. 2A and 2B, the release layer 16 is prepared with the carrier 10. However, as discussed herein, in some other embodiments, the release layer 16 can be prepared with a semiconductor element 20 on a device portion 22. FIGS. 6A-6E illustrate a bonding method according to various embodiments in which the release layer 16 is prepared with a semiconductor element 20. FIGS. 6A-6E can be generally similar to FIGS. 2A-2E. Unless otherwise noted, the components of FIGS. 6A-6E may be similar to or the same as like components of other figures disclosed herein.

In one aspect, a bonding method is disclosed. The bonding method can include providing a first element having a device portion and a first nonconductive bonding material disposed over the device portion of the first element. The bonding method can include providing a second element that includes a carrier. The second element has a substrate and a second nonconductive bonding material disposed over the substrate of the second element. The bonding method can include depositing a release layer between the device portion and the first nonconductive bonding material of the first element or between the substrate and the second nonconductive bonding material of the second element. The bonding method can include directly bonding the first nonconductive bonding material of the first element to the second nonconductive bonding material of the second element without an intervening adhesive. The bonding method can include removing the second element from the first element by transferring thermal energy to the release layer to thereby induce diffusion of gas including volatile species out of the release layer.

In one embodiment, the volatile species includes hydrogen.

In one embodiment, the volatile species includes a halogen.

In one embodiment, the volatile species includes hydrogen and fluorine.

In one embodiment, the release layer is deposited by way of plasma-enhanced vapor deposition (PECVD).

In one embodiment, the release layer has a thickness in a range between 10 nm to 3 μm.

In one embodiment, the release layer includes carbon. The release layer can include amorphous carbon. The amorphous carbon can include hydrogen. The amorphous carbon can include fluorine.

In one embodiment, the transferring thermal energy includes heating the directly bonded second element and first element.

In one embodiment, the transferring thermal energy includes radiating the release layer through the substrate of the second element. The radiating can include laser rastering. The substrate can be transparent to laser light used for the laser rastering.

In one embodiment, the transferring thermal energy includes rapid thermal annealing, thermal annealing, or microwave heating.

In one embodiment, the transferring thermal energy causes the release layer to outgas volatile species thereby weakening a bond between the first element and the second element to effectuate the removal of the second element from the first element. The volatile species can include hydrogen. The volatile species can include a halogen. The volatile species can include hydrogen and fluorine.

In one embodiment, the directly bonding includes contacting the first element and the second element and heating the contacted first element and second element with a first temperature lower than a second temperature used for heating the directly bonded second element and first element for the removal. The second temperature can be in a range of 100° C. to 400° C. The second temperature can be in a range of 200° C. to 250° C.

In one embodiment, the bonding method further includes, prior to the direct bonding, activating at least one of a surface of the first nonconductive bonding material and a surface of the second nonconductive bonding material.

In one embodiment, the first nonconductive bonding material includes an inorganic dielectric material.

In one embodiment, the second nonconductive bonding material includes an inorganic dielectric material.

In one embodiment, the depositing the release layer is conducted on an intervening layer such that the intervening layer is positioned between the substrate of the second element and the release layer. The intervening layer can be configured to serve an adhesion function between the release layer and the substrate.

In one embodiment, the bonding method further includes, after the directly bonding, processing the first element. The processing the first element can include thinning a back side of the first element. The back side is opposite the first nonconductive bonding material. The processing the first element can include forming interconnects on the back side of the first element. The bonding method can further include bonding a debond tape to the thinned back side of the first element. The removing can be performed after bonding the debond tape to the first element. The bonding method can further include directly bonding a second first element to the first element. The removing can be performed after directly bonding the second first element to the first element.

In one embodiment, the bonding method further includes, after the removing, ashing a surface of the first element removed from the second element.

In one embodiment, the bonding method further includes, after the removing, singulating the first element into a plurality of singulated first elements.

In one embodiment, the bonding method further includes, before the removing, singulating the second element and the first element into a plurality of bonded structures.

In one embodiment, the depositing the release layer is conducted on an intervening layer over the device portion of the first element, such that the intervening layer is positioned between the device portion of the first element and the release layer.

In one embodiment, the depositing the release layer is conducted on the second element prior to forming the second nonconductive bonding material. A footprint of the release layer can be smaller than a footprint of the second nonconductive bonding material such that an end of the release layer is inset relative to an end of the second nonconductive bonding material. The end of the release layer can be covered by the second nonconductive bonding material. The bonding method can further include depositing a second release layer between the device portion and the first nonconductive bonding material of the first element. The second release layer can be configured to outgas at a temperature that is higher than a temperature for the release layer to outgas.

In one embodiment, the bonding method further includes tuning a deposition process for depositing the release layer to tune an amount of volatile gases within the release layer. Tuning the amount of volatile gases can include adjusting a fluorine-hydrogen ratio. Tuning the amount of volatile gases can include adjusting a substrate bias or a deposition precursor flow rate of a plasma enhance chemical vapor deposition process.

In one embodiment, the bonding method further includes providing a reflection layer between the release layer and the first element.

In one aspect, a bonding method is disclosed. The bonding method can include providing a first element having a device portion and a first nonconductive bonding material disposed on the device portion of the first element. The bonding method can include providing a second element having a substrate, an intervening layer disposed on the substrate, an amorphous carbon layer that includes volatile gaseous species disposed on the intervening layer, and a second nonconductive bonding material disposed on the amorphous carbon layer. The bonding method can include directly bonding the first nonconductive bonding material of the first element to the second nonconductive bonding material of the second element without an intervening adhesive.

In one embodiment, the volatile gaseous species includes fluorine and hydrogen.

In one embodiment, the method further includes removing the second element from the first element by transferring thermal energy to the amorphous carbon layer to induce diffusion of gas out of the amorphous carbon layer In one embodiment, providing the second element includes depositing the amorphous carbon layer by way of plasma-enhanced chemical vapor deposition (PECVD).

In one embodiment, the transferring thermal energy includes heating the directly bonded second element and first element.

In one embodiment, the transferring thermal energy includes radiating the amorphous carbon layer through the substrate of the second element. The radiating can include laser rastering, and wherein the substrate is transparent to laser light used for the laser rastering.

In one embodiment, the transferring thermal energy includes rapid thermal annealing, thermal annealing, or microwave heating.

In one embodiment, the transferring thermal energy causes the amorphous carbon layer to outgas hydrogen and fluorine thereby weakening the amorphous carbon layer to effectuate the removal of the second element from the first element.

In one embodiment, the directly bonding includes contacting the first element and the second element and heating the contacted first element and second element with a first temperature lower than a second temperature used for heating the directly bonded second element and first element for the removal.

In one embodiment, the bonding method further includes, prior to the direct bonding, activating at least one of a surface of the first nonconductive bonding material and a surface of the second nonconductive bonding material.

In one embodiment, the first nonconductive bonding material includes a dielectric material.

In one embodiment, the second nonconductive bonding material includes a dielectric material.

In one embodiment, the bonding method further includes, after the directly bonding, thinning a back side of the first element, the back side opposite the nonconductive bonding material. The bonding method can further include bonding a debond tape to the thinned back side of the first element. The removing can be performed after bonding the debond tape to the first element. The bonding method can further includes directly bonding a second first element to the first element. The removing can be performed after directly bonding the second first element to the first element.

In one embodiment, the bonding method further includes, after the removing, ashing a surface of the first element removed from the second element.

In one embodiment, the bonding method further includes, after the removing, singulating the first element into a plurality of singulated first elements.

In one embodiment, the bonding method further includes, before the removing, singulating the second element and the first element into a plurality of bonded structures.

In one embodiment, a footprint of the amorphous carbon layer is smaller than a footprint of the second nonconductive bonding material.

In one embodiment, the bonding method further includes depositing a second amorphous carbon layer between the device portion and the first nonconductive bonding material. The amorphous carbon layer can be disposed between the substrate and the second nonconductive bonding material.

In one embodiment, the bonding method further includes tuning an amount of volatile gases within the amorphous carbon layer by tuning deposition conditions for the amorphous carbon layer. Adjusting the amount of volatile gases can include adjusting a fluorine-hydrogen ratio.

In one embodiment, the bonding method further includes providing a reflection layer between the amorphous carbon layer and the first element.

In one aspect, a carrier is disclosed. The carrier can include a substrate, an intervening layer on the substrate, a deposited carbon layer that is configured to outgas when heated, and a nonconductive bonding layer on the deposited carbon layer. The nonconductive bonding layer is configured to directly bond to a semiconductor element.

In one embodiment, the deposited carbon layer includes amorphous carbon. The amorphous carbon can include fluorine and hydrogen. The deposited carbon layer can have a thickness uniformity within 3%. The fluorine and hydrogen can represent between 10 wt. % and 85 wt. % of the deposited carbon layer.

In one embodiment, the nonconductive bonding layer is prepared for direct bonding. A surface of the nonconductive bonding layer can have a root-mean-square (rms) surface roughness of less than 2 nm and is configured for direct bonding.

In one aspect, a semiconductor element is disclosed. The semiconductor element can include a device portion, an intervening layer on the device portion, a deposited release layer that is configured to outgas hydrogen and fluorine when heated, a nonconductive bonding layer on the deposited release layer. The nonconductive bonding layer is configured to directly bond to an element.

In one embodiment, the deposited release layer is an amorphous carbon layer that comprises hydrogen and fluorine. The fluorine and hydrogen can represent between 10 wt. % and 85 wt. % of the deposited carbon layer.

In one embodiment, the deposited release layer has a thickness uniformity within 3%.

In one embodiment, the nonconductive bonding layer is prepared for direct bonding. A surface of the nonconductive bonding layer has a root-mean-square (rms) surface roughness of less than 2 nm.

In one aspect, a temporary bonding method is disclosed. the bonding method can include providing a first element having a device portion and a first nonconductive bonding material disposed over the device portion of the first element. The bonding method can include providing a second element having a substrate and a second nonconductive bonding material disposed over the substrate of the second element. The bonding method can include depositing a release layer by way of plasma enriched chemical vapor deposition (PECVD) between the device portion and the first nonconductive bonding material of the first element, or between the substrate and the second nonconductive bonding material of the second element. The bonding method can include directly bonding the first nonconductive bonding material of the first element to the second nonconductive bonding material of the second element without an intervening adhesive.

In one embodiment, the transferring thermal energy induces diffusion of hydrogen and fluorine.

In one embodiment, the bonding method further includes removing the second element from the first element by transferring thermal energy to the release layer to thereby induce diffusion of gas out of the release layer. The release layer can include an amorphous carbon layer that includes hydrogen and fluorine. Removing can include outgassing hydrogen and fluorine.

In one aspect, a bonding method is disclosed. The bonding method can include providing a first element having a device portion and a first nonconductive material disposed over the device portion of the first element. The bonding method can include providing a second element having a substrate and a second nonconductive material disposed over the substrate of the second element. The bonding method can include depositing a release layer by way of plasma enriched chemical vapor deposition (PECVD) on the first nonconductive material of the first element or the second nonconductive material of the second element. The bonding method can include providing a third nonconductive material on the release layer, and directly bonding the first nonconductive material or the second nonconductive material to the third nonconductive material without an intervening adhesive.

In one embodiment, the bonding method further includes removing the second element from the first element by transferring thermal energy to the release layer to thereby induce diffusion of gas out of the release layer In one embodiment, the first, second, and third nonconductive materials comprises an inorganic dielectric material.

In one embodiment, the release layer includes an amorphous carbon layer that includes hydrogen and fluorine that can outgas in response to heating.

Unless the context clearly requires otherwise, throughout the description and the claims, the words “comprise,” “comprising,” “include,” “including” and the like are to be construed in an inclusive sense, as opposed to an exclusive or exhaustive sense; that is to say, in the sense of “including, but not limited to.” The word “coupled”, as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonding method comprising:

providing a first element having a device portion and a first nonconductive bonding material disposed over the device portion of the first element;

providing a second element comprising a carrier, the second element having a substrate and a second nonconductive bonding material disposed over the substrate of the second element;

depositing a release layer between the device portion and the first nonconductive bonding material of the first element or between the substrate and the second nonconductive bonding material of the second element;

directly bonding the first nonconductive bonding material of the first element to the second nonconductive bonding material of the second element without an intervening adhesive; and removing the second element from the first element by transferring thermal energy to the release layer to thereby induce diffusion of gas including volatile species out of the release layer.

2. The bonding method of claim 1, wherein the volatile species comprises hydrogen, halogen, or fluorine.

3. The bonding method of claim 1, wherein the release layer is deposited by way of plasma-enhanced vapor deposition (PECVD).

4. The bonding method of claim 1, wherein the release layer has a thickness in a range between 10 nm to 3 μm, and the release layer comprises carbon or amorphous carbon.

5. The bonding method of claim 1, wherein the transferring thermal energy comprises radiating the release layer through the substrate of the second element, the radiating comprises laser rastering, and wherein the substrate is transparent to laser light used for the laser rastering.

6. The bonding method of claim 1, wherein the directly bonding comprises contacting the first element and the second element and heating the contacted first element and second element with a first temperature lower than a second temperature used for heating the directly bonded second element and first element for the removal, and the second temperature is in a range of 100° C. to 400° C.

7. The bonding method of claim 1, wherein the depositing the release layer is conducted on an intervening layer such that the intervening layer is positioned between the substrate of the second element and the release layer, the intervening layer is configured to serve an adhesion function between the release layer and the substrate.

8. The bonding method of claim 1, further comprising, after the directly bonding, processing the first element, wherein the processing the first element comprises thinning a back side of the first element, the back side being opposite the first nonconductive bonding material.

9. The bonding method of claim 1, wherein the depositing the release layer is conducted on an intervening layer over the device portion of the first element, such that the intervening layer is positioned between the device portion of the first element and the release layer.

10. The bonding method of claim 1, wherein the depositing the release layer is conducted on the second element prior to forming the second nonconductive bonding material.

11. The bonding method of claim 10, wherein a footprint of the release layer is smaller than a footprint of the second nonconductive bonding material such that an end of the release layer is inset relative to an end of the second nonconductive bonding material.

12. The bonding method of claim 1, further comprising tuning a deposition process for depositing the release layer to tune an amount of volatile gases within the release layer, wherein tuning the amount of volatile gases comprises adjusting a fluorine-hydrogen ratio, and tuning the amount of volatile gases comprises adjusting a substrate bias or a deposition precursor flow rate of a plasma enhance chemical vapor deposition process.

13. The bonding method of claim 1, further comprising providing a reflection layer between the release layer and the first element.

14. The bonding method of claim 1, further comprising directly bonding the first element to a third element such that a nonconductive field region of the first element is directly bonded to a nonconductive field region of the third element, and a conductive feature of the first element is directly bonded to a conductive feature of the third element.

15. A bonding method comprising:

providing a first element having a device portion and a first nonconductive bonding material disposed on the device portion of the first element;

providing a second element having a substrate, an intervening layer disposed on the substrate, an amorphous carbon layer comprising volatile gaseous species disposed on the intervening layer, and a second nonconductive bonding material disposed on the amorphous carbon layer; and directly bonding the first nonconductive bonding material of the first element to the second nonconductive bonding material of the second element without an intervening adhesive.

16. The bonding method of claim 15, wherein the volatile gaseous species comprises fluorine and hydrogen.

17. The bonding method of claim 15, wherein providing the second element comprises depositing the amorphous carbon layer by way of plasma-enhanced chemical vapor deposition (PECVD).

18. The bonding method of claim 15, further comprising removing the second element from the first element by transferring thermal energy to the amorphous carbon layer to induce diffusion of gas out of the amorphous carbon layer.

19. The bonding method of claim 18, wherein the transferring thermal energy comprises heating the directly bonded second element and first element.

20. The bonding method of claim 18, wherein the transferring thermal energy comprises radiating the amorphous carbon layer through the substrate of the second element.

* * * * *